United States Patent [19]

Eichelberger et al.

[11] Patent Number: 4,894,115

[45] Date of Patent: Jan. 16, 1990

[54] LASER BEAM SCANNING METHOD FOR FORMING VIA HOLES IN POLYMER MATERIALS

[75] Inventors: Charles W. Eichelberger, Schenectady; Robert J. Wojnarowski, Ballston Lake; Kenneth B. Welles, II, Scotia, all of N.Y.

[73] Assignee: General Electric Company, Schenectady, N.Y.

[21] Appl. No.: 310,149

[22] Filed: Feb. 14, 1989

[51] Int. Cl.$^4$ .......................... B44C 1/22; B29C 37/00; C03C 15/00; C03C 25/06

[52] U.S. Cl. ......................................... 156/643; 134/1; 156/644; 156/651; 156/655; 156/668; 156/345; 204/192.36; 219/121.69; 219/121.85

[58] Field of Search ............... 156/643, 644, 651, 655, 156/668, 345; 204/192.36; 427/53.1; 250/492.1, 492.3; 219/121.65, 121.66, 121.68, 121.69, 121.85; 134/1

[56] References Cited

U.S. PATENT DOCUMENTS

| | | | |
|---|---|---|---|
| 4,617,085 | 10/1986 | Cole, Jr. et al. | 156/643 |
| 4,714,516 | 12/1987 | Eichelberger et al. | 156/628 |
| 4,764,485 | 8/1988 | Loughran et al. | 437/225 |
| 4,780,177 | 10/1988 | Wojnarowski et al. | 156/643 |

OTHER PUBLICATIONS

H. S. Cole et al., *Laser Processing for Interconnect Technology*, SPIE vol. 877 Micro-Optoelectronic Materials (1988), pp. 92-96.

*Primary Examiner*—William A. Powell
*Attorney, Agent, or Firm*—Marvin Snyder; James C. Davis, Jr.

[57] ABSTRACT

The surface of a polymer dielectric layer is scanned repeatedly with a high energy continuous wave laser in a pattern to create via holes of desired size, shape and depth. This is followed by a short plasma etch. The via holes are produced at commercial production rates under direct computer control without use of masks and without damage to conductor material underlying the dielectric layer. A two-step technique usable to form a large hole to a partial depth in the dielectric layer and several smaller diameter holes within the large hole through the remainder of the dielectric layer depth allows formation of a large number of holes in a given area of a thick dielectric layer.

27 Claims, 6 Drawing Sheets

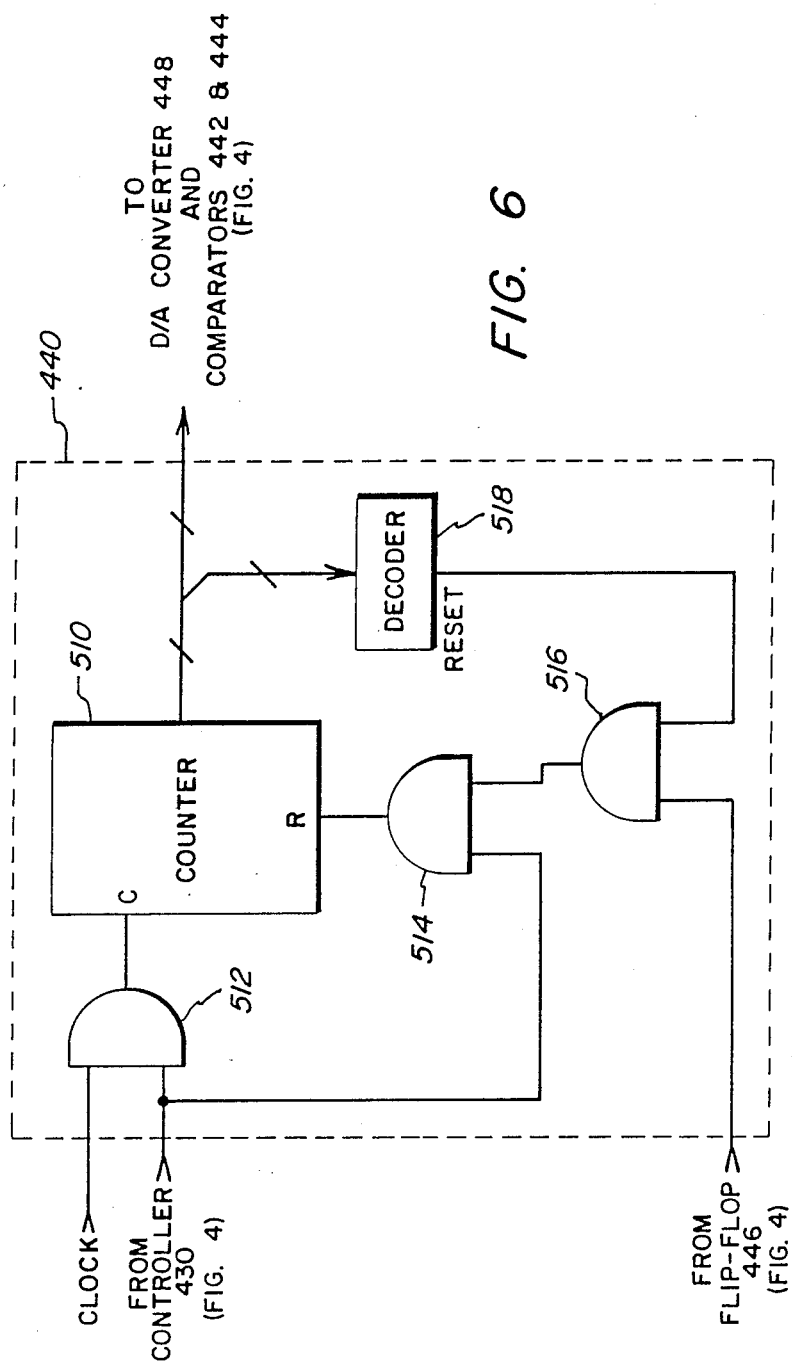

LASER BEAM SCANNING METHOD FOR FORMING VIA HOLES IN POLYMER MATERIALS

BACKGROUND OF THE INVENTION

1. Field of the Invention

This invention generally relates to a method and apparatus for producing via holes in polymer dielectrics without use of a mask. More particularly, the invention relates to a method for packaging electronic integrated circuit chips disposed on a substrate wherein via openings are produced in a polymer film overlaid on the chips to facilitate electrically interconnecting the chips through the vias thus formed.

2. Description of the Prior Art

Formation of via holes to allow for electrical connection between two or more layers of conductor separated by a layer of dielectric material has heretofore been accomplished by several methods, each of which has limitations.

In one prior method, via holes are formed by depositing a metal masking layer over the dielectric layer, patterning the masking layer to expose areas of the dielectric layer where via holes are desired, and then selectively etching the exposed areas of the dielectric layer through the masking layer. Either chemical or plasma etching techniques are used to remove the dielectric from the exposed areas, although use of either technique has its own unique drawbacks. Certain dielectric materials cannot conveniently be chemically etched since they absorb chemical etchants, causing damage to the dielectric material underlying the metal masking layer. In addition, some chemical etchants are known to attack metallization, thus requiring special attention when the via being etched is designed to expose an aluminum interconnect pad on a very large scale integrated circuit (VLSI) chip. The anisotropic nature of plasma etching tends to produce barrel-shaped via holes. Depositing metallization in barrel-shaped via holes is very difficult. Moreover, thickness variations in the dielectric layer being etched may result in excessive plasma etching in certain areas with marginal etching in others.

In another known method, photo-patternable polymer materials are applied to a substrate and then exposed to light in the areas where via holes are desired. After exposure, the polymer is developed, and baked at high temperatures. This method has three prominent limitations. First, it may only be used with photo-patternable materials. Second, the thickness of material which can be photopatterned is limited to approximately a maximum of 5 microns, due to the inherent properties of the material and sensitizers therefor. Third, the photo-patternable materials must be deposited in liquid form and then merely dried such that they may be easily developed. Prereacted film overlays, such as Kapton ® polyimide film available from E.I. du Pont de Nemours and Company, Wilmington, Del., cannot be used.

Another prior method involves forming pillars of conductor material on a substrate and filling in around the pillars with a dielectric. In this method, a layer of metallization on a substrate is first patterned and the metal is then built up by electroplating to form the pillars. Polymer material is then sprayed or spun onto the substrate in multiple coats, leaving sufficient curing time between coats to allow solvent and by-products of the curing process to escape. Enough coats are applied to completely cover the conductors on the substrate, but to barely cover the pillars. Following a short etch sufficient to uncover the top surfaces of the pillars, the pillars can function as metal-filled vias. This method has the disadvantages of requiring an excessive number of steps and the use of more difficult wet processing techniques.

Eichelberger et al. U.S. Pat. No. 4,714,516, issued Dec. 22, 1987 and assigned to the instant assignee, discloses the use of an argon ion laser to form vias. Selected areas of the dielectric are damaged with laser energy and the damaged areas are then etched with oxygen plasma. The damaged portion of the dielectric etches at a much higher rate than the undamaged portion. One qualification on use of this approach arises because hole depth is limited by the amount of damage at the surface; that is, the via hole must be at least as wide at the top as the thickness of the dielectric material to be drilled. As a practical matter, via hole depths are limited to about 10 microns; therefore, thicker dielectric material requires extra steps in the formation of a via. For example, via formation would require at least the steps of damaging the dielectric with the laser, cleaning out the resulting hole with plasma, and thereafter damaging the dielectric at the bottom of the hole with the laser, followed by again cleaning out the hole with plasma. Another limitation to this approach is that the surface of the dielectric layer is exposed to excessive amounts of plasma. A substantial amount of plasma is required to clean out the holes and the undamaged dielectric surface tends to become rough from exposure to the plasma. The rough surface makes subsequent metallizations difficult to pattern.

Pulsed lasers such as excimer and doubled YAG lasers have been used to directly ablate dielectric layers. By this technique, laser energy is absorbed in a thin layer of the dielectric in sufficient amounts to evaporate or ablate the thin layer of dielectric where the laser beam impinges. Multiple pulses are required to ablate holes of increased depth. Care must be taken to avoid ablating the underlying metal with laser pulses since the energy necessary to heat the polymer to ablation temperatures can also destroy the metallization underlying the dielectric. To effectively practice this method, only very small thicknesses of dielectric may be removed per pulse and, as a result, the method requires an excessive number of pulses. Lasers emitting visible light are not acceptable for this ablation technique because the penetration depth is too great.

The direct laser ablation technique limits electronic package manufacturers to use of circular via holes. Round vias, however, are not as good as rectangular vias since they limit the area available for electrical contact; that is, rectangular vias are easily enlarged into larger rectangular vias without leaving residual materials in the bottom of the holes. Yet the shape of the via holes formed using this technique is unavoidably circular because the laser energy is a focussed version of the laser cavity. Even if a non-circular mask opening is used as an aperture, the laser lens will nevertheless focus the energy as a circle. Changing via hole sizes requires a sophisticated zoom lens which can change focal length and f number to balance the conflicting optical requirements for hole size variation and constant depth of focus.

Direct laser ablation techniques also do not allow for creation of sufficiently narrow via hole sizes in thick dielectrics, i.e., dielectrics too thick to be patterned by conventional photoresist techniques. The top of the hole is necessarily larger for larger thicknesses of dielectric, with the result that hole size at the top becomes too large when working with thick dielectrics. Yet thick dielectrics are desirable for many applications. When working with self-standing dielectric films, thicker films are easier to handle. Thick dielectrics are advantageous in systems where capacitance of conductor lines must be minimized. In addition, thick dielectrics are preferred for compliance with radiation hardness requirements - the dielectric must be sufficiently thick to absorb the secondary electrons generated by conductors overlying semiconductors.

SUMMARY OF THE INVENTION

It is therefore an object of this invention to provide a method for forming via holes of various sizes and shapes in dielectrics of various types and thicknesses, including fully-reacted films, at commercial rates and with a minimum number of processing steps.

Another object is to provide a method for forming via holes of various sizes and shapes in dielectrics of various types and thicknesses, under direct computer control, without use of masks and without causing damage to the underlying conductor material.

Another object is to provide a method for forming via holes in thick dielectrics in a stepped profile for minimum hole sizes and maximum hole densities.

Briefly, in accordance with a preferred embodiment of the invention, a continuous wave laser beam is focussed to a very high energy density and dithered or scanned at a high scan rate, while also being advanced in a direction perpendicular to the dither direction so as to move over the entire area of a dielectric where a via hole is to be formed. The energy density in the focussed spot must be sufficient to heat a surface layer of the dielectric material within that spot to the point of vaporization or dissociation of the polymer. This constitutes what is known as ablation. The duty cycle must be such that the surrounding dielectric material is not heated to a degree which causes damage, and the wavelength of the laser must be such that a predominant portion of the energy is absorbed in a very thin uppermost section of the dielectric. The hole may be scanned in a raster format, which allows complete control over the size and shape of the hole. During this process, the laser removes a small amount of dielectric material on each scan and the scans are repeated until the underlying metallization is exposed. A computer controls the output of the laser, scanning or dithering (i.e., rapid to-and-fro movement) of the laser beam, and movement of an X-Y table carrying the structure undergoing ablation.

DESCRIPTION OF THE DRAWINGS

The foregoing and other objects, aspects and advantages of the invention will be better understood from the following detailed description of a preferred embodiment of the invention with reference to the drawings, in which:

FIG. 6 is a block diagram of one example of counter logic circuitry for use in the apparatus shown in FIG. 4.

DETAILED DESCRIPTION OF A PREFERRED EMBODIMENT OF THE INVENTION

Figure 1A:
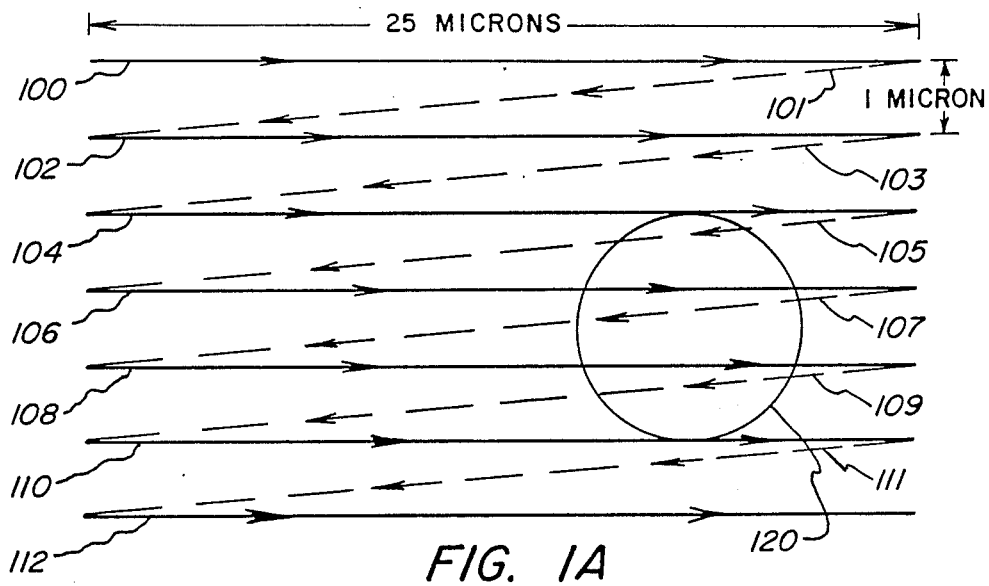
FIG. 1A and 1B are plan views of alternative laser beam scan patterns which may be used for etching a via hole.
Figure 1B:
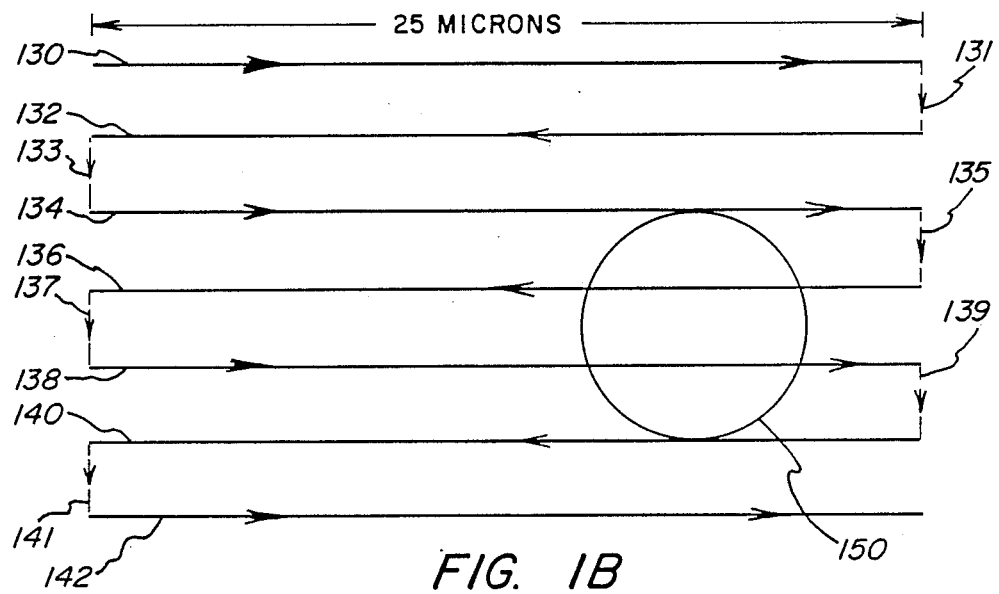

FIG. 1A and 1B are top view illustrations of two alternative scan patterns which may be used to produce a typical via hole. FIG. 1A illustrates a raster scan pattern for application to a surface onto which a focussed laser beam spot 120 impinges. The parallel scans of the laser beam are all in the same direction, each being 25 microns in extent. The solid lines 100, 102, 104, 106, 108, 10 and 122 indicate the paths along which the laser beam is scanned, in sequence, in the direction of the arrows. Each of these paths may be considered to be in an easterly direction (or +X direction in a Cartesian coordinate system). After each easterly scan, there is a relatively brief time delay before the next scan. During this time, the laser beam is blocked, or turned off, while it is repositioned relative to the area being scanned (as though the beam were moved generally westerly along the diagonal, dashed lines 101, 103, 105, 107, 109 and 111, in sequence). Thus, path 101 is traversed after scan 100, and is followed by scan 102, then path 103, etc. The incrementation in the southerly (or −Y) direction is such that parallel scan lines 100, 102, 104, 106, 108, 110 and 112 are spaced 1 micron apart. Scanning is done at the rate of three meters per second. The diameter of the maximum energy spot 120 is approximately 3 microns. After traversal of a raster has been completed, the process is repeated with the easterly scans progressing in the northerly (or +Y) direction relative to the area being scanned.

FIG. 1B shows an alternative scan pattern which may be considered as a modified raster scan. This scan pattern differs from that shown in FIG. 1A in that the laser beam is scanned in both X directions. Thus, the laser beam scans along lines 130, 134, 138, and 142 by moving easterly (in the +X direction), while in alternate scans along lines 132, 136 and 140 the beam moves westerly (in the −X direction). The laser beam is turned off, or blocked, while it is incremented between successive east-west scans (as though it were moved southerly along each of the dashed lines 131, 133, 135, 137, 139 and 141) by 1 micron. Spacing between adjacent scan lines is thus 1 micron. The maximum energy spot 150 is approximately 3 microns in diameter. The etching process for the scan pattern of FIG. 1A is thus similar to that for the scan pattern of FIG. 1B, while those skilled in the art will recognize that other scan patterns can be devised to effect the same etching process.

As a specific example of the etching process according to the invention, a dielectric polymeric layer of Kapton polyimide or of silicone-polyimide, 25 to 30 microns in thickness, can be etched in approximately 4 raster scans. Since the maximum energy spot size is approximately 3 microns in diameter, the spot overlaps the scan lines, which are spaced apart from each other by 1 micron, by a factor of 3. Thus in 4 raster scans, the same area is scanned by the laser beam a total of 12 times (i.e., 3 overlaps multiplied by 4 scans). A depth of approximately 2.5 microns of dielectric material is removed by each scan of the laser beam, so that approximately 30 microns of material is removed during the 12 passes made by the laser beam. Since the beam is focussed to a spot of maximum energy in a diameter of 3 microns and the power within that spot is 0.25 watts, then the power density of the spot is $3.3 \times 10^6$ watts per square centimeter (watt/cm$^2$). At a laser wavelength of 351 nanometers, the surface layer, or depth of dielectric material to which the laser energy penetrates before being virtually completely absorbed, is 1–3 microns, depending on the material. For a laser beam dwell time of 1 microsecond, the approximate volume of material exposed to the laser beam is the product of the maximum energy spot size area and the absorption depth. This is a 3 micron depth multiplied by the roughly square (but with rounded corners) area exposed to a 3 micron diameter spot, or approximately $2.7 \times 10^{-11}$ cm$^3$. This extremely small volume can be heated to vaporization temperature in less than 1 microsecond by the $3.3 \times 10^6$ watt/cm$^2$ energy density spot. The system works effectively because very small volumes of material are vaporized at very fast rates, much like machining away a small amount of material in a conventional machining operation.

Figure 2A:
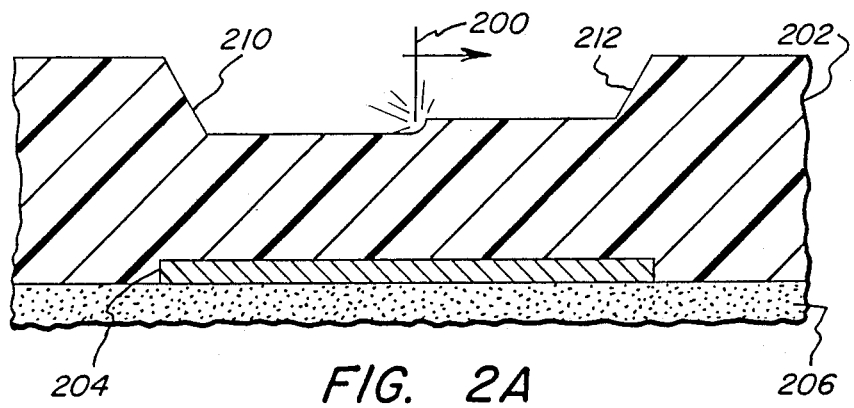
FIGS. 2A, 2B and 2C are progressive crosssectional side views illustrating the results of laser beam dithering carried out in accordance with the present invention.
Figure 2B:
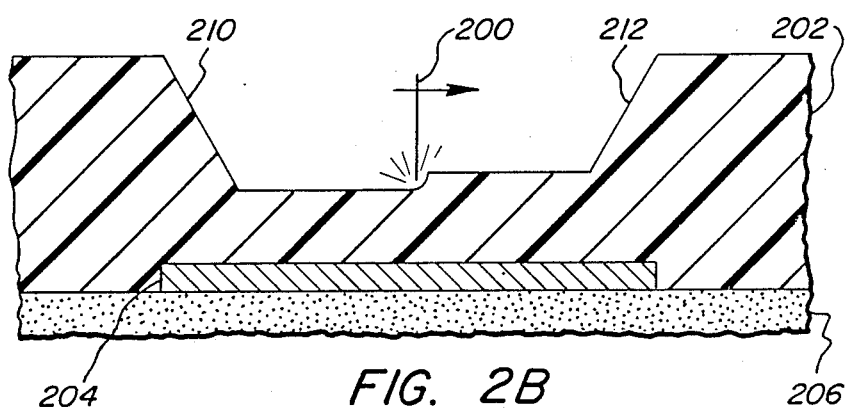
Figure 2C:
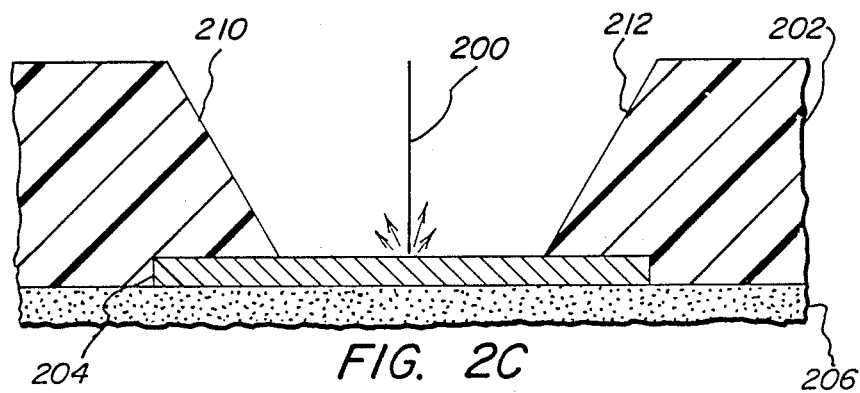

FIGS. 2A through 2C illustrate progression of the via hole formation process of the invention from 1 raster scan to the next. A continuous wave laser beam 200 is focused to a very high energy density over a dielectric polymer layer 202, which is situated atop a metal contact pad 204 on a substrate 206. Substrate 206 may comprise an integrated circuit chip, in which case contact pad 204 comprises a chip pad thereon. Alternatively, substrate 206 may comprise a multilevel printed circuit board or ceramic multilayer substrate for hybrid assemblies in which case layer 204 is a metal run and layer 206 is insulation between successive, vertically-stacked metal runs. As another alternative, metal run 204 may be situated directly on a printed circuit board 206. FIGS. 2A and 2B show the effect of laser beam 200 being scanned across polymer layer 202. Beam scanning occurs at a rate of 3 meters per second. As shown in FIG. 2C, laser beam 200 is reflected when the beam reaches metal contact pad 204. Since well over half the energy of the beam is reflected by pad 204 and since pad 204 is highly thermally conductive and exhibits a substatially higer termal diffusivity than the material of polymer layer 202, the surface temperature of pad 204 remains well below the metal vaporization point. As a result, the drilling action ceases when the metal pad has been exposed. In the present embodiment, the laser beam impinges on polymer layer 202 only 1% of the time, such that only 1% of the laser power, or 2.5 milliwatts, is applied to the via during its formation. This amount of power is well below the threshold for damage to adjacent areas of polymer 202. The sides of the hole formed by this laser drilling action, such as sides 210 and 212, slope toward the center because they do not experience the overlapping scans that occur in the central portions of the hole and the etching process therefore proceeds more slowly at the sides of the hole. If the raster is scanned more times than required to reach underlying metal pad 204, sides 210 and 212 of the hole will be steepened somewhat from their illustrated slopes.

The via holes produced by the laser beam are cleaned by a short plasma etch cycle which removes from underlying metal pad 240 any particles formed during the laser beam scanning, such as soot, any residual polymer, or any glass that may be residual from any glass removal operation performed when etching a pad mask, and cleans and roughens the upper surface of dielectric polymer layer 202 in order to enhance adhesion of subsequent metallization. The presently preferred plasma etch technique is to preheat both the part (i.e., subtrate) and chamber in which the part is placed, to a temperature of 110° C., and then to etch the part for 2 minutes at a power of 150 watts in an atmosphere of 20% CF$_4$ and 80% 0$_2$. This assumes that four 2"×2" substrates are etched in the chamber. The amount of polymer dielectric etched by this technique is between 2 and 4 microns.

Figure 3:
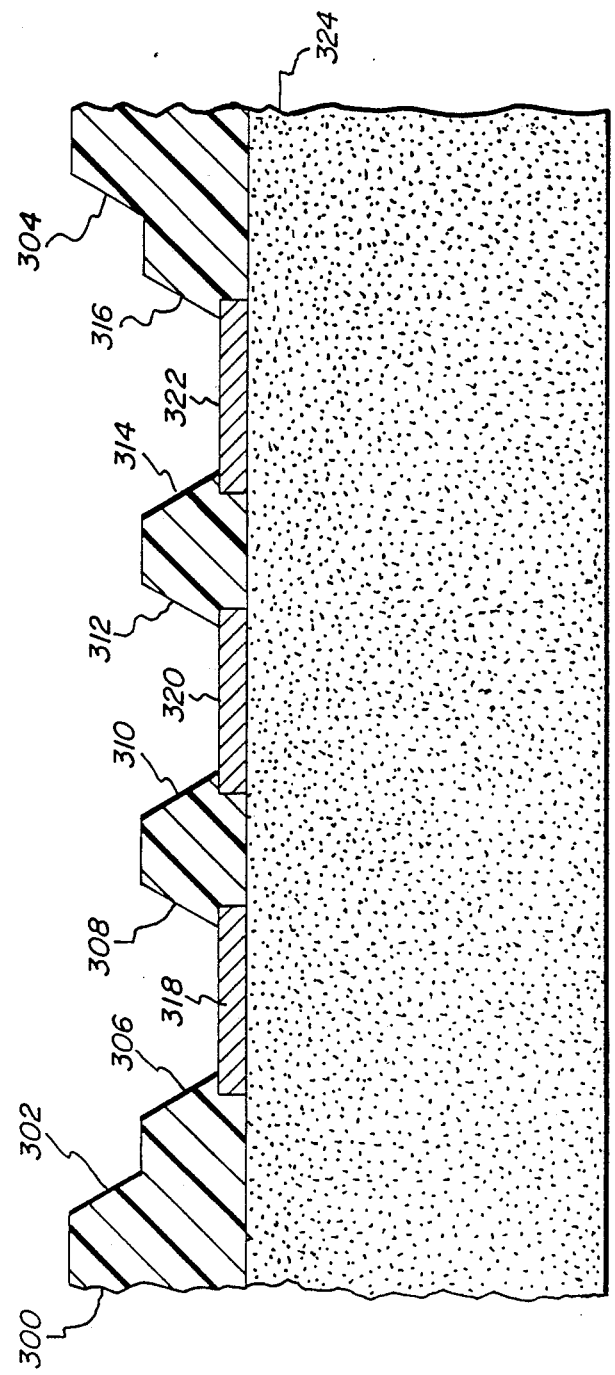
FIG. 3 is a cross-sectional side view of a group of closely spaced via holes with sloping sidewalls formed in a two-step process employing the laser beam dithering of the present invention.

FIG. 3 illustrates an application of the method of the present invention to increase the number of via holes possible in a given area in thick dielectric polymer layers. The dielectric polymer layer 300, as shown, has first been scanned by the laser beam across a relatively large area to produce the opening that extends from side 302 to side 304, but with only a sufficient number of scans to remove a portion of the depth of the polymer material. This is the result of large scans or dithers between side 302 and side 304, which cause ablation to a depth, in this case, of approximately one-half the thickness of polymer layer 300. Then the three smaller openings between side 306 and side 308, between side 310 and side 312, and between side 314 and side 316, respectively, are formed using two additional raster scans of reduced dimensions. These three smaller openings extend all the way down to metal pads 318, 320 and 322 mounted on substrate 324, so as to constitute vias having sloping sidewalls to facilitate metallization. Despite the relative depth of these three via holes and the relative thickness of polymer layer 300, each of the three via holes is still relatively small in diameter at its respective top.

Figure 4:
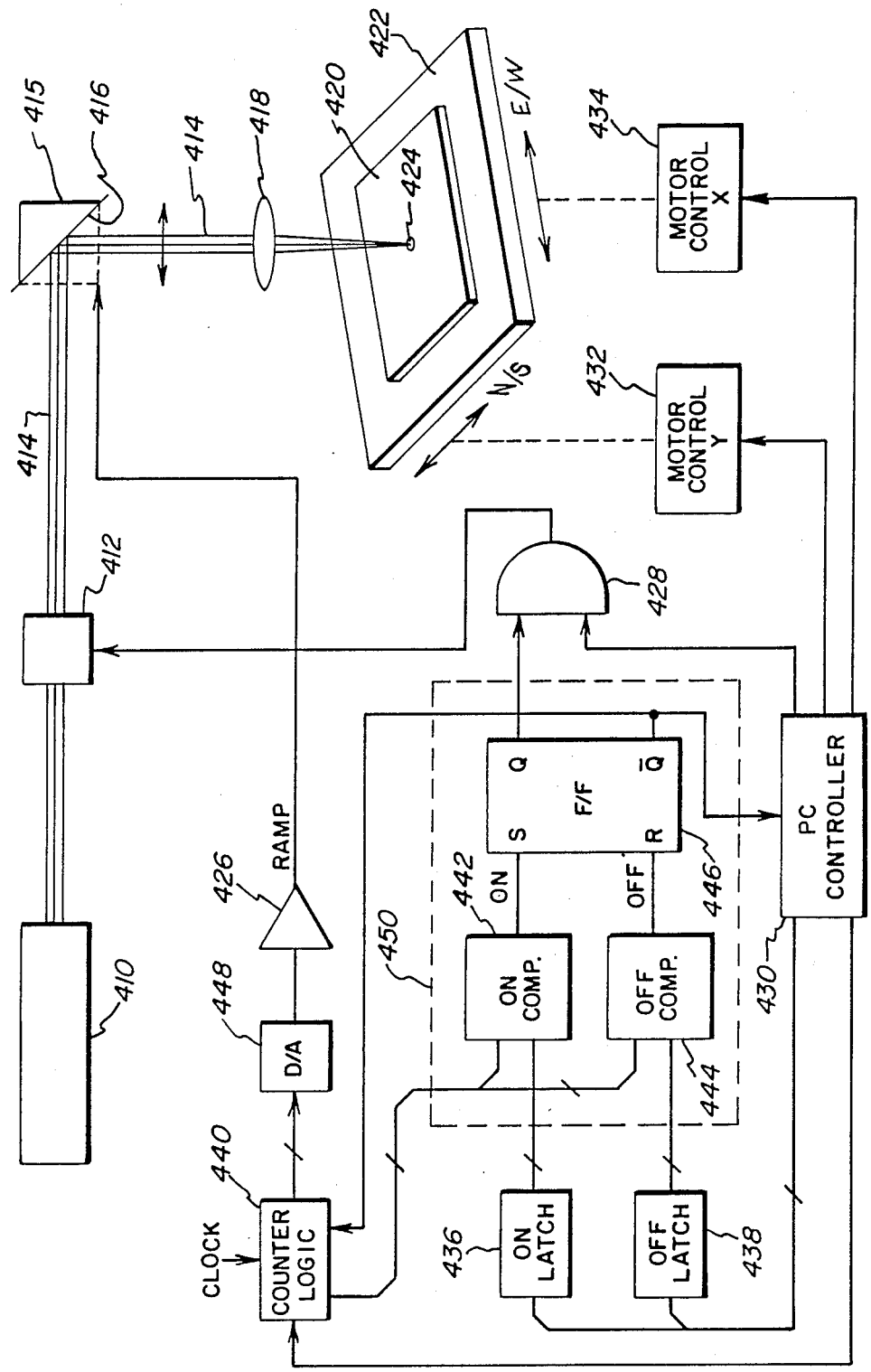
FIG. 4 is a part block and part schematic diagram of laser apparatus for carrying out the method of the present invention.

FIG. 4 illustrates laser apparatus for forming via holes by the laser beam dither method of the present invention. Laser 410 may be a 3.5 watt Spectra Physics 2035-35 argon ion laser with ultraviolet optics. This is a continuous wave (CW) laser which emits ultraviolet radiation. The main ultraviolet line is 351 nanometers, and the laser power output is nominally 1.2 watts. The beam produced by the laser is modulated by a modulator, such as an acoustooptical modulator 412. One such acousto-optical modulator useable in the invention is a Newport Electro Optics Quartz 5080-3 modulator. The modulated laser beam 414 strikes a scanning mirror 416 and is reflected to a lens 418 which focuses it upon a substrate 420 situated on an XY positioning table 422 which allows movement of the chip in an X or Y direction relative to the laser beam. Substrate 420 may comprise a dielectric polymer layer overlying an integrated circuit chip. It will be appreciated by those skilled in the art that, in the alternative, other laser beam deflectors such as rotating mirrors, acousto optic deflection devices, or similar devices designed to deflect light in a precise manner, could be substituted for scanning mirror 416. The XY positioning table may be a Klinger Scientific model TCS 250-200 table. Lens 418 focuses what is preferably a millimeter diameter laser beam 414 to a spot 424 having a maximum energy region diameter of 3 microns. This lens is selected to keep the laser beam continually in focus on the area of dielectric polymer layer that is to be ablated. For example, lens 418 may comprise a field-flattening lens capable of focusing ultraviolet energy.

Figure 5:
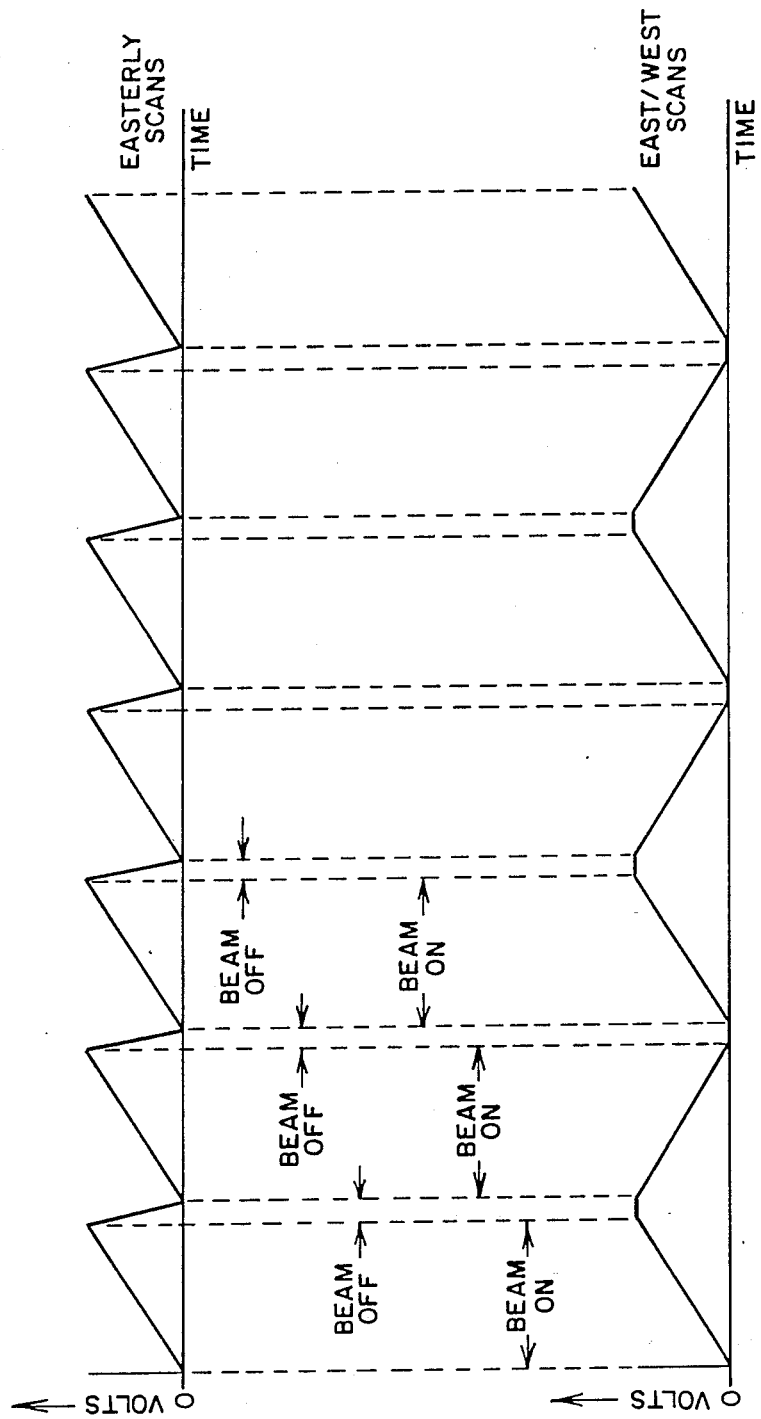
FIG. 5 illustrates ramp voltage waveforms generated in the circuit of FIG. 4 to produce the laser beam scan patterns shown in FIG. 1A and 1B.

The laser beam is scanned in the east/west (i.e., ±X) direction preferably by a General Scanning G120D galvanometer 415 which sweeps scanning mirror 416 in response to a ramp voltage output from amplifier 426. The ramp voltage appears as one or the other waveforms depicted in FIG. 5. For the raster scan of FIG. 1A, the laser beam is scanned in easterly directions only, and the waveform appears as designated for easterly scans; i.e., a relatively slowly rising ramp voltage followed by a relatively rapid flyback or return to the starting voltage level, designated 0, and a repetition of the rising ramp voltage, etc. During the rising voltage, the laser beam is on for either the full extent of the rise or some predetermined portion thereof, and during the falling voltage the beam is off. For the raster scan of FIG. 1B, the laser beam is dithered, or alternately scanned in an easterly direction and a westerly direction, and the waveform appears as designated for east/west scans; i.e., a rising ramp voltage (easterly scan) followed by a brief pause at the maximum voltage, and thereafter a falling ramp voltage (westerly scan) followed by a brief pause at the starting voltage level, designated 0, and a repetition of the rising ramp voltage, etc.

As shown in FIG. 4, an AND gate 428 having one input energized by a controller 430 controls modulator 412 to either pass or block the laser beam. Controller 430, which may comprise a programmed IBM Personal Computer (PC), also controls positioning of XY table 422 through servo motor controls 432 for the north-/south (i.e., ±Y) direction and 434 for the east/west direction.

Controller 430 loads ON and OFF values in latches or registers 436 and 438 which define the extent or limits of the east/west laser beam scanning introduced by galvanometer-controlled scanning mirror 416. Each respective one of latches 436 and 438 may comprise a Texas Instruments 74LS374 latch. Counter logic 440 operates under the control of controller 430 to provide an output count to ON and OFF comparators 442 and 444, respectively, each of which may comprise a Texas Instruments 74521 8-bit comparator, respectively. When the count from counter logic 440 equals the value stored in latch 436, comparator 442 produces an ON output signal which sets a flip-flop 446. Likewise, when the count from counter logic 440 equals the value stored in latch 438, comparator 444 produces an OFF output signal which resets flip-flop 446. Comparators 442 and 444, together with flip-flop 446, comprise switching circuitry 450. The Q or true output of flip-flop 446 supplies an input voltage to AND gate 428, while the $\overline{Q}$ or false output of flip-flop 446 supplies an input voltage to both counter logic 440 and controller 430. The count output from counter logic 440 is also supplied to a digital-to-analog converter 448, such as an Analog Devices AD656 converter, which generates the scanning ramp voltage that is supplied to amplifier 426. Thus when in the presence of an ON signal from comparator 442 AND gate 428 is enabled by controller 430, the output signal produced by AND gate 428 defines the time during which the laser beam is passed by modulator 412, and this in turn corresponds to the duration of the easterly or westerly scan of the laser beam on the substrate by galvanometer-controlled scanning mirror 416.

In operation, the XY table 422 is commanded by controller 430 to the appropriate position for beginning the etching process. This is accomplished in a manner well known in the art by actuating motor controls 432 and 434 to cause table 422 to rapidly arrive at the beginning scan position. At the same time, controller 430 loads latches 436 and 438 with the appropriate ON and OFF values for the area to be etched. As will be understood by those skilled in the art, the values loaded in latches 436 and 438 may be selected to control both length and position of the laser beam scans, depending on the specific implementation of the invention. When the proper table position has been reached, controller 430 enables AND gate 428 in the manner previously mentioned, and the first easterly scan of the laser beam commences. At the completion of that scan, controller 430 moves the XY table in the southerly direction by 1 micron and initiates either another easterly scan of the beam, for the raster scan pattern of FIG. 1A, or a westerly scan of the beam, for the raster scan pattern of FIG. 1B, by driving galvanometer-controlled scanning mirror 416 in the appropriate direction. The process is repeated with the XY table being incremented in the southerly direction by step pulses from controller 430 for each scan of the laser beam resulting from motion of mirror 416. After completion of the first raster, the next raster is scanned with the XY table being incremented in the northerly direction for each scan of the laser beam resulting from motion of mirror 416. When the requisite number of raster scans have been made, controller 430 deenergizes its input to AND gate 428 to shut off the laser beam, and appropriately energizes motor controls 432 and 434 to move the XY table to the next location where a via hole is desired. Hole size in the east/west direction is controlled by the numbers loaded into latches 436 and 438. Hole size in the north-/south direction is controlled by the number of step pulses supplied from controller 430 to Y axis motor control 432. Y axis control 432 thus serves a dual purpose: first, acting as a slew servo to rapidly position XY table 422 in cooperation with X axis control 434, and second, acting as an incrementing servo to control the extent of the raster scan in the north/south or ±Y direction. Controller 430 controls both of these modes of operation of Y axis control 432.

One suitable embodiment of counter logic 430 is shown in detail in FIG. 6. This implementation produces the raster scan shown in FIG. 1A. The logic comprises a counter 510, such as a Texas Instruments 74163 counter, which is initially reset by controller 430 via OR gate 514 and counts in response to clock pulses supplied via AND gate 512 when enabled by controller 430. The count output of counter 510 is supplied to ON and OFF comparators 442 and 444 and D/A converter 448, shown in FIG. 4. When the count output of counter 510 equals a predetermined value as detected by decoding logic 518, a reset signal is supplied to AND gate 516 which is enabled by the $\overline{Q}$ output voltage from flip-flop 446.

For purposes of this description, it will be assumed that the values loaded in latches 436 and 438 of FIG. 4 do not represent the full extent of the east/west scan of the laser beam produced by mirror 416, but only that portion of the scan during which the laser beam is passed by modulator 412. Thus, the scan (i.e., motion of mirror 416) is begun before the beam turns on and continues after the beam turns off. In this manner, the laser beam can be made to scan through only the most linear portion of each sweep of galvanometer 415 to achieve uniform ablation over the scanning area of the dielectric polymer layer. In addition, the beam may thus be controlled to pass through only the most central portion of lens 418 to ensure that beam distortion introduced by the lens is minimized. The XY table is incremented in the southerly direction during the flyback portion of the voltage waveform shown in FIG. 1A. The entire process is somewhat analogous to television raster scanning, a major exception being that incremental movement takes place in either direction on the Y axis, depending on the "frame" being scanned.

The alternative scanning pattern shown in FIG. 1B is produced by a modification to the circuitry of FIG. 6. In this case, counter 510 is an up/down counter and the decoding logic 518 detects both a predetermined count and a zero count. The result of either detected count does not reset counter 510 but rather controls the direction of counting of the counter. Accordingly, in the presence of a signal from controller 430, clock pulses supplied through AND gate 512 drive counter 510 to continuously count up and down between a zero count and a predetermined count, and the count output of counter 510 is supplied to comparators 442 and 444 and to D/A converter 448. Because the laser beam now undergoes east/west scans, the voltage waveform output from D/A converter 448 is now generally a triangular wave, as indicated for the east/west scans in FIG. 5, rather than a sawtooth wave as indicated for the easterly scans in FIG. 5; that is, the signal controlling galvanometer mirror 416 ramps in two directions rather than just one. In addition, PC controller 430 must supply data to the on and off latches 436 and 438 to coincide with each east or west direction of scan.

While the invention has been described in terms of a single preferred embodiment, those skilled in the art will recognize that the invention can be practiced with modifications or changes. It is, therefore, to be understood that the appended claims are intended to cover all such modifications and changes as fall within the true spirit and scope of the invention.

What is claimed is:

1. A method for producing via holes in a polymer dielectric layer comprising the steps of:
   scanning a predetermined area of the polymer dielectric layer with a laser beam in a predetermined pattern at a sufficient level of energy and speed to heat a small volume of the polymer dielectric to a point of vaporization during a predetermined laser beam dwell time, said volume being the product of the laser beam maximum energy spot area and the depth of a surface layer portion of the polymer dielectric layer; and
   repeating said scanning of said area for a sufficient number of times to etch a desired amount of polymer dielectric layer from said predetermined area.

2. The method of claim 1 wherein said polymer dielectric layer is situated on a precision positioning table and said scanning of said predetermined area is achieved by deflecting said beam along the X axis of a set of Cartesian coordinates and moving said table along the Y axis of said set of coordinates.

3. The method of claim 1 further comprising the steps of:
   repositioning said polymer dielectric layer relative to said laser beam so that said beam scans an additional predetermined area of said polymer dielectric layer in said predetermined pattern and at said level of energy and speed; and
   repeating said scanning of said additional predetermined area for a sufficient number of times to etch a desired amount of polymer dielectric from said additional predetermined area.

4. The method of claim 3 wherein the sufficient number of scans of said predetermined area by said laser beam is equal to the sufficient number of scans of said additional predetermined area by said laser beam.

5. The method of claim 3 in which said polymer dielectric layer is situated on a precision positioning table and said repositioning is accomplished by moving said table.

6. The method of claim 4 in which said polymer dielectric layer is situated on a precision positioning table and said repositioning is accomplished by moving said table.

7. The method of claim 1 wherein said laser beam is produced by a high energy continuous wave laser.

8. The method of claim 7 wherein said laser beam is modulated by a laser beam modulator and is deflected by a laser beam deflector during each predetermined scan pattern.

9. The method of claim 7 wherein said laser comprises an argon ion laser.

10. The method of claim 7 wherein said laser beam is produced at a wavelength of 351 nanometers.

11. The method of claim 1 further comprising the step of plasma etching the polymer dielectric layer to remove any residual particles from an underlying metal conductor pad and to clean and roughen the surface of the polymer dielectric layer to enhance adhesion of subsequent metallization.

12. The method of claim 11 in which said plasma etching is performed in an atmosphere comprising approximately 80% oxygen and 20% $CF_4$ and at a temperature of 110° C.

13. The method of claim 1 further comprising the step of focussing said laser beam to a spot of approximately 3 microns in diameter on said predetermined area of the polymer dielectric layer.

14. The method of claim 1 wherein said scanning is accomplished by moving the focal point of said laser beam from one edge of the predetermined pattern across the surface of said polymer dielectric layer to the opposite edge of said predetermined pattern in a series of parallel scan lines all in the same direction, said focal point falling upon said one edge of the predetermined pattern at a predetermined distance from the immediately-preceding scan line in a direction perpendicular to the scan lines after each line has been scanned.

15. The method of claim 1 wherein said scanning is accomplished by moving the focal point of said laser beam from one edge of the predetermined pattern across the surface of said polymer dielectric layer to the opposite edge of said predetermined pattern in a series of parallel scan lines in alternating directions, said focal point being moved a predetermined distance from the immediately-preceding scan line along either edge of said predetermined pattern after each line has been scanned.

16. A method for producing via holes in a polymer dielectric layer comprising the steps of:
   scanning a first predetermined area of the polymer dielectric layer with alaser beam in a first predetermined pattern at a sufficient level of energy and speed to heat a small volume of the polymer dielectric to a point of vaporization during a predetermined laser beam dwell duration, said volume being the product of the laser beam maximum energy spot size and the depth of a surface layer portion of the polymer dielectric layer;

repeating said scanning of said first predetermined pattern for a sufficient number of times to etch a first desired amount of polymer dielectric from said first predetermined area;

scanning a second predetermined area of the polymer dielectric layer with said laser beam in a second predetermined pattern at said level of energy and speed to heat another said small volume of the polymer dielectric to a point of vaporization during said predetermined laser beam dwell duration, said second predetermined area being entirely within said first predetermined area; and repeating said scanning of said second predetermined pattern for a sufficient number of times to etch a second desired amount of polymer dielectric from said second predetermined area.

17. The method of claim 16 wherein said polymer dielectric layer is situated on a precision positioning table and said scanning of each of said first and second predetermined areas is achieved by deflecting said beam along the X axis of a set of Cartesian coordinates and moving said table along the Y axis of said set of coordinates.

18. The method of claim 16 wherein the sufficient number of scans of said first predetermined area by said laser beam is equal to the sufficient number of scans of said second predetermined area by said laser beam.

19. The method of claim 16 wherein said laser beam is produced by a high energy continuous wave laser.

20. The method of claim 19 wherein said laser beam is modulated by a laser beam modulator and is deflected by a laser beam deflector during each predetermined scan pattern.

21. The method of claim 19 wherein said laser comprises an argon ion laser.

22. The method of claim 19 wherein said laser beam is produced at a wavelength of 351 nanometers.

23. The method of claim 16 further comprising the step of plasma etching the polymer dielectric layer to remove any residual particles from an underlying metal conductor pad and to clean and roughen the surface of the polymer dielectric layer to enhance adhesion of subsequent metallization.

24. The method of claim 23 in which said plasma etching is performed in an atmosphere comprising approximately 80% oxygen and 20% $CF_4$ and at a temperature of 110° C.

25. The method of claim 16 further comprising the step of focussing said laser beam to a spot of approximately 3 microns in diameter.

26. The method of claim 16 wherein scanning of each of said first and second areas is accomplished by moving the focal point of said laser beam from one edge of either predetermined pattern across the surface of the polymer dielectric layer to the opposite edge of said either pattern in a series of parallel scan lines all in the same direction, said focal point falling upon said one edge of said either pattern at a predetermined distance from the immediately preceding scan line in a direction perpendicular to the scan lines after each line in said either pattern has been scanned.

27. The method of claim 16 wherein scanning of each of said first and second areas is accomplished by moving the focal point of said laser beam from one edge of either predetermined pattern across the surface of the polymer dielectric layer to the opposite edge of said either pattern in a series of parallel scan lines in alternating directions, said focal point being moved a predetermined distance from the immediately-preceding scan line along either edge of said predetermined pattern after each line in said either pattern has been scanned.

* * * * *